(12) United States Patent
Dudulwar et al.

(10) Patent No.: US 10,333,689 B2
(45) Date of Patent: Jun. 25, 2019

(54) HIGH SPEED SENSE AMPLIFIER LATCH WITH LOW POWER RAIL-TO-RAIL INPUT COMMON MODE RANGE

(71) Applicant: Intel Corporation, Santa Clara, CA (US)

(72) Inventors: Pankaj Vinayak Dudulwar, Bayan Lepas (MY); Chenchu Punnarao Bandi, Bayan Lepas (MY); Lip Khoon Teh, Tanjung Bungah (MY); Tat Hin Tan, Bayan Lepas (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/262,859

(22) Filed: Sep. 12, 2016

(65) Prior Publication Data

US 2016/0380753 A1    Dec. 29, 2016

Related U.S. Application Data

(63) Continuation of application No. 14/688,990, filed on Apr. 16, 2015, now Pat. No. 9,443,567.

(51) Int. Cl.
*G11C 7/06* (2006.01)
*G11C 7/08* (2006.01)
(Continued)

(52) U.S. Cl.
CPC ............ *H04L 7/0037* (2013.01); *G11C 7/065* (2013.01); *G11C 7/08* (2013.01); *G11C 7/10* (2013.01); *G11C 7/1078* (2013.01); *G11C 11/165* (2013.01); *G11C 11/4093* (2013.01); *G11C 11/4096* (2013.01); *H03L 7/0812* (2013.01);
(Continued)

(58) Field of Classification Search
CPC ................................ G11C 7/065; G11C 7/062
See application file for complete search history.

(56) References Cited

U.S. PATENT DOCUMENTS 5,231,318 A    7/1993  Reddy
5,789,948 A    8/1998  Kim et al.
(Continued)

OTHER PUBLICATIONS

International Search Report and Written Opinion for PCT Application No. PCT/US2016/017227 dated Jun. 13, 2016, 10 pages.
(Continued)

*Primary Examiner* — Ross Varndell
(74) *Attorney, Agent, or Firm* — Green, Howard & Mughal, LLP

(57) ABSTRACT

Described is an apparatus which comprises: an input sensing stage for sensing an input signal relative to another signal; a decision making circuit, coupled to the input sensing stage, for determining whether the input signal is a logic low or a logic high; and a power management circuit, coupled to the input sensing stage and the decision making circuit, which is operable to monitor a state of the decision making circuit and to disable the input sensing stage according to the monitored state. Described is an apparatus which comprises: a decision making circuit integrated with an input sensing stage, wherein the decision making circuit is operable to pre-charge its internal nodes during a phase of the clock signal; and a latching circuit to latch an output of the decision making circuit.

26 Claims, 6 Drawing Sheets

(51) Int. Cl.
*G11C 7/10* (2006.01)
*H04L 7/00* (2006.01)
*G11C 11/16* (2006.01)
*H03L 7/081* (2006.01)
*H04L 27/00* (2006.01)
*G11C 11/4093* (2006.01)
*G11C 11/4096* (2006.01)

(52) U.S. Cl.
CPC .......... *H04L 27/0002* (2013.01); *G11C 7/062* (2013.01); *G11C 7/106* (2013.01); *G11C 7/1057* (2013.01); *G11C 7/1084* (2013.01); *G11C 7/1087* (2013.01)

(56) References Cited

U.S. PATENT DOCUMENTS

| | | | |
|---|---|---|---|
| 5,963,060 A | 10/1999 | Varadajan et al. | |
| 6,518,798 B2 | 2/2003 | Telecco | |
| 7,227,798 B2 | 6/2007 | Gupta et al. | |
| 7,298,180 B2 | 11/2007 | Hung | |
| 8,063,685 B1 | 11/2011 | Narula et al. | |
| 9,520,891 B1* | 12/2016 | Kull | H03M 1/462 |
| 2002/0084838 A1* | 7/2002 | Martin | H03K 3/35613 |
| | | | 327/560 |
| 2003/0052715 A1* | 3/2003 | Barnes | G11C 7/065 |
| | | | 327/51 |
| 2004/0008068 A1 | 1/2004 | Kim | |
| 2004/0088624 A1 | 5/2004 | Gauthier et al. | |
| 2004/0136253 A1 | 7/2004 | Gupta et al. | |
| 2007/0252630 A1* | 11/2007 | Sumesaglam | G11C 7/1078 |
| | | | 327/218 |
| 2009/0108881 A1 | 4/2009 | Wilson | |
| 2013/0266055 A1* | 10/2013 | Matsumoto | H04L 25/06 |
| | | | 375/232 |
| 2013/0321048 A1* | 12/2013 | He | G01S 19/235 |
| | | | 327/156 |
| 2014/0002188 A1* | 1/2014 | Chen | H03F 3/19 |
| | | | 330/250 |
| 2014/0176193 A1 | 6/2014 | De Vita et al. | |
| 2014/0203851 A1* | 7/2014 | Desai | H03K 5/1565 |
| | | | 327/155 |
| 2016/0254806 A1* | 9/2016 | Chong | H03K 5/2481 |
| | | | 327/52 |

OTHER PUBLICATIONS

Non-Final Office Action for U.S. Appl. No. 14/688,990 dated Oct. 27, 2015, 8 pages.
Notice of Allowance for U.S. Appl. No. 14/688,990 dated May 12, 2016, 8 pages.
International Preliminary Report on Patentability for International Patent Application No. PCT/US16/17227, dated Oct. 26, 2017.
Notice of Allowance for Taiwan Patent Application No. 105107604, dated Aug. 25, 2017.
Office Action and search Report for Taiwan Patent Application No. 105107604, dated Apr. 20, 2017.
Extended European Search Report dated Dec. 20, 2018 for European Patent Application 16780406.1.

* cited by examiner

HIGH SPEED SENSE AMPLIFIER LATCH WITH LOW POWER RAIL-TO-RAIL INPUT COMMON MODE RANGE

CLAIM FOR PRIORITY

This application is a continuation of U.S. patent application Ser. No. 14/688,990, filed on 16 Apr. 2015, titled "HIGH SPEED SENSE AMPLIFIER LATCH WITH LOW POWER RAIL-TO-RAIL INPUT COMMON MODE RANGE," which is incorporated herein by reference in its entirety for all purposes.

BACKGROUND

Sense Amplifier Latch (SAL) is used for receiving input data. One example of a traditional SAL is Strong Arm Latch. However, traditional SALs have poor performance at low operating supply voltages. For example, when operating supply voltage is below 1V, traditional SALs fail to sense the input signal with respect to a fixed voltage reference (i.e., traditional SALs do not have rail-to-rail input common mode range). Traditional SALs also exhibit high clock-to-out (Tco) delays at lower operating voltages, which makes the traditional SALs incompatible for use in low voltage and high speed input-output (I/O) links.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
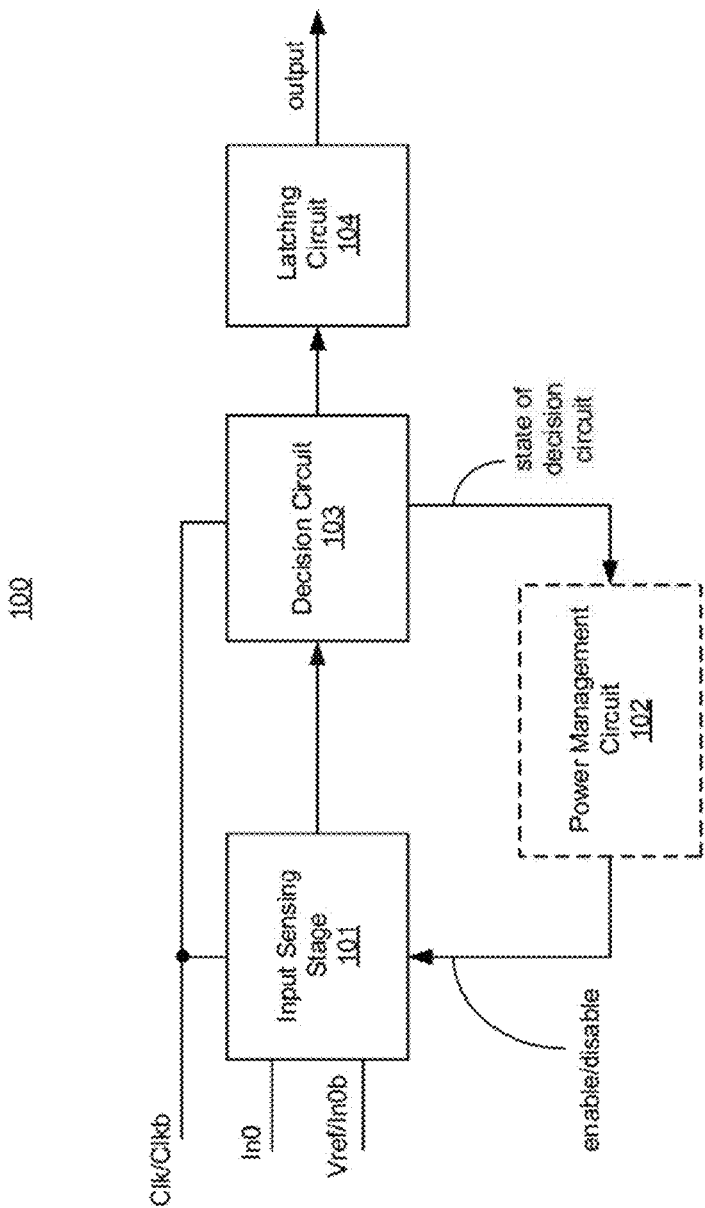
FIG. 1 illustrates a high-level architecture of a Sense Amplifier Latch (SAL), according to some embodiments of the disclosure.

Some embodiments describe a low power Sense Amplifier Latch (SAL) with rail-to-rail Input Common Mode Range (ICMR). In some embodiments, the SAL comprises: an input sensing stage, a decision making circuit, and a power management circuit. In some embodiments, the input sensing stage senses an input signal relative to another signal (e.g., a reference signal or a complement of the input signal). In some embodiments, the input sensing stage comprises complementary devices to enable rail-to-rail ICMR.

In some embodiments, the decision making circuit is coupled to the input sensing stage and determines whether the input signal is a logic low or a logic high. In some embodiments, internal nodes of the decision making circuit are pre-charged to a pre-determined logic level (i.e., to logic low or logic high) to enable high speed determination of whether the input signal is a logic low or a logic high.

In some embodiments, the power management circuit, which is coupled to the input sensing stage and the decision making circuit, is operable to monitor a state of the decision making circuit and to disable the input sensing stage according to the monitored state. In some embodiments, the power management circuit comprises a detection logic that monitors the outputs of decision making circuit so as to disable the current flow through the input sensing stage when the decision making circuit has determined the stage of the input signal (i.e., has determined whether the input signal is a logic low or logic high).

In some embodiments, the SAL operates in three phases—pre-charge phase, evaluation phase, and latch phase. During the pre-charge phase, in some embodiments, the nodes of the decision making circuit are pre-charged to known voltages (e.g., logic zero or logic ones). One reason for pre-charging the nodes is to ensure that the internal nodes do not have unwanted charge that may cause data detection failure or to prematurely fasten the evaluation phase. During the evaluation phase, in some embodiments, the nodes of the decision making circuit are charged or discharged to ensure that the cross-coupling circuit of the decision making circuit operates properly (i.e., it is activated to resolve its decision). As such, full-swing data is achieved at the nodes providing the decided data. In some embodiments, during the evaluation phase, the power management circuit disables the input sensing stage to save power. During the latch phase, in some embodiments, the data decided by the decision making circuit is latched and held at its value during the pre-charge state.

There are many technical effects of various embodiments. For example, the sensitivity of the SAL is better than traditional SALs (i.e., the ability of the SAL of various embodiments to detect input data relative to a reference signal is far better than traditional SALs). In one example, the sensitivity of the SAL is four times better than the sensitivity of conventional SALs. The clock-to-output delay (Tco) of the SAL is much smaller than the Tco of conventional SALs. As such, the SAL of various embodiments can be used for low voltage designs operating at high data rates (e.g., data rates of 8 Giga bits per second (Gbps) and higher). In some embodiments, by separating the operation phases into pre-charge, evaluate, and latch phases, the SAL can disable its input sensing stage during the evaluation phase to save power. Other technical effects will be evident from various embodiments.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical, mechanical, or magnetic connection between the things that are connected, without any intermediary devices. The term "coupled" means either a direct electrical, mechanical, or magnetic connection between the things that are connected or an indirect connection through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The terms "substantially," "close," "approximately," "near," and "about," generally refer to being within +/−20% of a target value. Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

For purposes of the embodiments, the transistors in various circuits, modules, and logic blocks are metal oxide semiconductor (MOS) transistors, which include drain, source, gate, and bulk terminals. The transistors also include Tri-Gate and FinFET transistors, Gate All Around Cylindrical Transistors, Tunneling FET (TFET), Square Wire, or Rectangular Ribbon Transistors or other devices implementing transistor functionality like carbon nano tubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors—BJT PNP/NPN, BiCMOS, CMOS, eFET, etc., may be used without departing from the scope of the disclosure.

FIG. 1 illustrates a high-level architecture 100 of a SAL, according to some embodiments of the disclosure. In some embodiments, architecture 100 comprises an Input Sensing Stage 101, Power Management Circuit 102, Decision Circuit 103, and Latching Circuit 104. In some embodiments, Power Management Circuit 102 is removed as described with reference to FIG. 4.

Referring back to FIG. 1, in some embodiments, Input Sensing Stage 101 compares an input signal "in" relative to a reference voltage "Vref" to determine whether the input signal is a logic low or logic high. In some embodiments, Input Sensing Stage 101 comprises complementary devices to enable rail-to-rail ICMR. In some embodiments, Input Sensing Stage 101 is enabled during a phase of clock signal Clk. For example, Input Sensing Stage 101 is enabled to sense the input signal "in" when the phase of Clk is high and when the phase of Clkb is low, where Clkb is an inverse or complement of Clk. Some embodiments of Input Sensing Stage 101 are described with reference to FIGS. 2-4.

Referring back to FIG. 1, in some embodiments, Input Sensing Stage 101 is a differential stage. In one such embodiment, "Vref" is replaced with a complement of the input signal "in" (i.e., "inb" is compared with "in," where "inb" is a complement or inverse of signal "in"). In some embodiments, Input Sensing Stage 101 comprises dual differential stages that lead to lower sensitivity of the detection. For example, the dual differential stages reduce input offset of Input Sensing Stage 101 so that it can resolve fine differences between the input signal "in" and "Vref" or "inb." Here, labels for signals and nodes are interchangeably used. For example, "in" may refer to input signal "in" or node "in" depending on the context of the sentence.

In some embodiments, Decision Circuit 103 receives the output of Input Sensing Stage 101 and determines whether this output is logic low or logic high (i.e., the state of the Decision Circuit 103). Some embodiments of Decision Circuit 103 are described with reference to FIGS. 2-4. Referring back to FIG. 1, in some embodiments, Decision Circuit 103 receives Clk and CLkb signals to cause Decision Circuit 103 to operate in pre-charge and evaluation phases. In some embodiments, during the pre-charge phase, the nodes of Decision Circuit 103 are pre-charged to known voltages (e.g., logic zero or logic ones). One reason for pre-charging the nodes is to ensure that the internal nodes do not have unwanted charge that may cause data detection failure or to prematurely fasten the evaluation phase. In some embodiments, during the evaluation phase, the nodes of Decision Circuit 103 are charged or discharged to ensure that the cross-coupling circuit of Decision Circuit 103 operates properly (i.e., it is activated). As such, full-swing data is achieved at the nodes providing the decided data.

In some embodiments, the full-swing data from Decision Circuit 103 is received by Latching Circuit 104, which provides the latched "output." In some embodiments, Latching Circuit 104 includes cross-coupled NAND or NOR logic gates to latch the output of Decision Circuit 103. In some embodiments, the data latched by Latching Circuit 104 is held at its value during the pre-charge phase of Decision Circuit 103.

In some embodiments, Power Management Circuit 102 is coupled to Decision Circuit 103 and Input Sensing Stage 101. In some embodiments, during the evaluation phase of Decision Circuit 103, Power Management Circuit 102 disables Input Sensing Stage 101 to save power. In some embodiments, during pre-charge phase of Decision Circuit 103, Power Management Circuit 102 enables Input Sensing Stage 101 (i.e., makes the Input Sensing Stage 103 operable to sense the input signal "in" relative to "vref" or "inb" signals). In some embodiments, Power Management Circuit 102 includes a detection logic that monitors the state of Decision Circuit 103 to disable the current flow through Input Sensing Stage 101. For example, during low frequency operation (e.g., less than 500 MHz), Input Sensing Stage 101 can be disabled to save power during the evaluation phase of Decision Circuit 103. In some embodiments, Power Management Circuit 102 is removed and Decision Circuit 103 integrated with Input Sensing Stage 101. One such embodiment is described with reference to FIG. 4.

Figure 2:
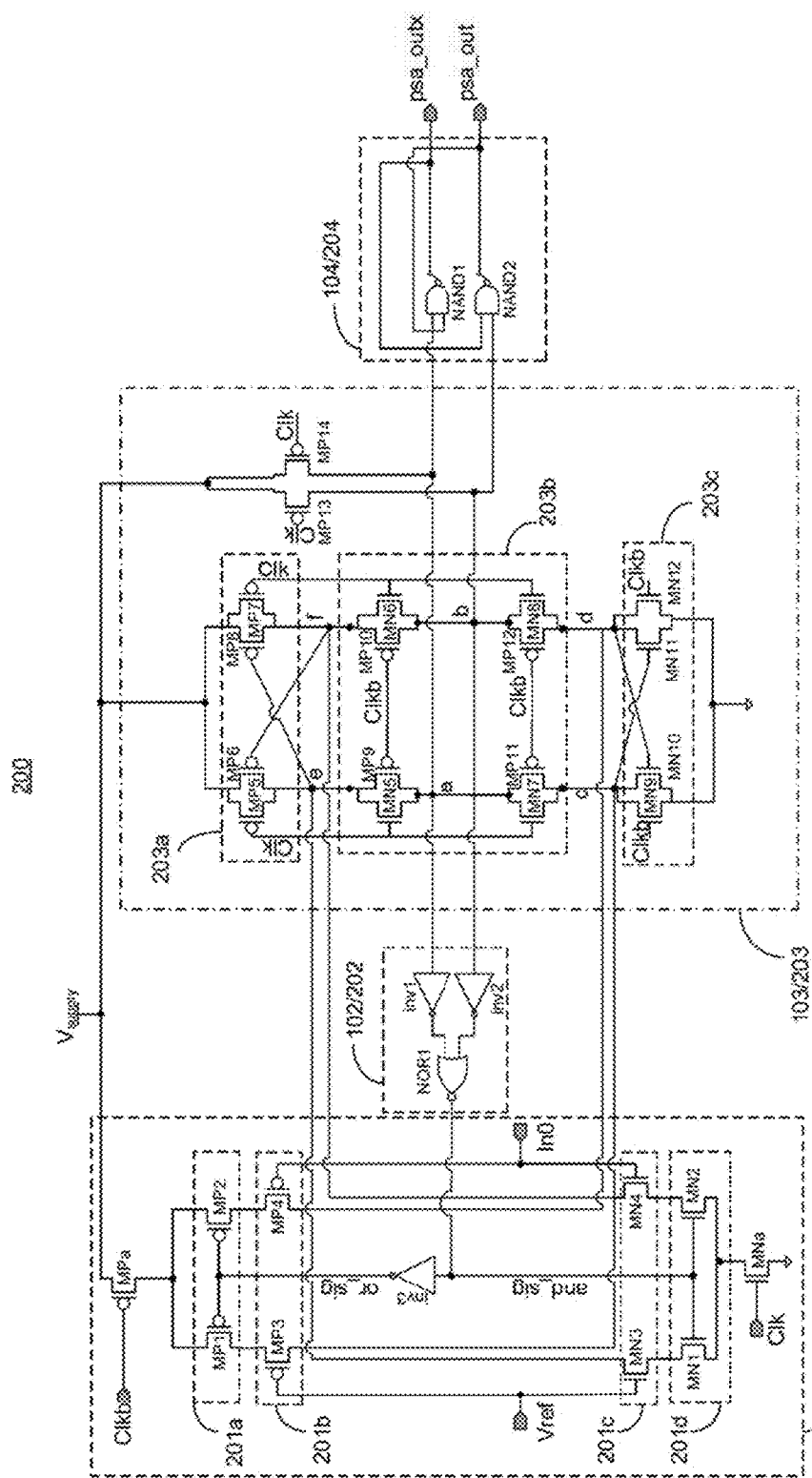
FIG. 2 illustrates a circuit implementation of a SAL, according to some embodiments of the disclosure.

FIG. 2 illustrates a circuit implementation of SAL 200, according to some embodiments of the disclosure. It is pointed out that those elements of FIG. 2 having the same reference numbers (or names) as the elements of any other figure can operate or function in any manner similar to that described, but are not limited to such.

In some embodiments, SAL 200 comprises Input Sensing Stage 101/201, Power Management Circuit 102/202, Decision Making Circuit 103/203, and Latch Circuit 104/204. In some embodiments, Input Sensing Stage 101/201 comprises p-types transistors MPa, MP1, MP2, MP3, and MP4 coupled together as shown. In some embodiments, Input Sensing Stage 101/201 comprises n-type transistors MNa, MN1, MN2, MN3, and MN4 coupled together as shown. In some embodiments, transistors MP1 and MP2 are part of a power saving circuit 201*a*. In some embodiments, transistors MN1 and MN2 are part of a power saving circuit 201*d*. In some embodiments, the gate terminals of transistors of power saving circuits 201*a/b* are controlled by the output of Power Management Circuit 102/202. For example, the output "and_sig" from Power Management Circuit 102/202 controls the gate terminals of transistors MN1 and MN2 while "or_sig" controls the gate terminals of transistors MP1 and MP2, where "or_sig" is generated by inverting "and_sig" by inverter inv3.

In some embodiments, transistors MP3 and MP4 are p-type input transistors 201*b* for receiving inputs "Vref" and "In0," respectively. In some embodiments, transistors MN3 and MN4 are n-type input transistors 201*c* for receiving inputs "Vref" and "In0," respectively. In some embodiments, by having p-type and n-type input transistors 201*b/c* receive the input signals, rail-to-rail ICMR is achieved. Rail-to-rail ICMR improves detection of logic 0 as well as logic 1 by Input Sensing Stage 101/201. In some embodiments, transistors MN3 and MN4 have the same size (i.e., same W/L) and transistors MP3 and MP4 have the same size.

In some embodiments, Input Sensing Stage 101/201 comprises header and footer devices MPa and MNa which are controllable by Clkb and Clk signals respectively. The source terminal of the header device MPa is coupled to $V_{supply}$ (i.e., power supply) and the source terminal of the footer device MNa is coupled to ground. As such, Input Sensing Stage 101/201 is enabled to sense input signals (i.e., "in0" and "Vref") during a high phase of Clk (i.e., a low phase of Clkb). In some embodiments, the drain/source terminal of transistor MP3, the drain/source terminal of transistor MP4, the drain/source terminal of MN3, and the drain/source terminal of MN4 are provided as output of Input Sensing Stage 101/201 for Decision Making Circuit 103/203.

In some embodiments, Decision Making Circuit 103/203 comprises header cross-coupled circuit 203*a*, footer cross-coupled circuit 203*c*, and pre-charge circuit 203*b*. In some embodiments, header and footer cross-coupled circuits 203*a/c* are coupled to pre-charge circuit 203*b*. In some embodiments, header and footer cross-coupled circuits 203*a/c* receive outputs from Input Sensing Stage 101/201 and evaluates them.

In some embodiments, header cross-coupled circuit 203*a* comprises p-type transistors MP5/MP6 and p-type transistor MP8/MP7 such that the drain terminal of transistor MN3 (i.e., node e') is coupled to the gate terminal of transistor MP8, and the drain terminal of transistor MN4 (i.e., node 'f') is coupled to the gate terminal of transistor MP6. A person skilled in the art would appreciate that drain and source terminals are different terminals but identical in terms fabrication of the transistor. In some embodiments, node 'e' is also coupled to the drain terminals of p-type pass-gate MP5/MP6 and to the source/drain terminals of MN5/MP9. In some embodiments, node 'f' is also coupled to the drain terminals of p-type pass-gate MP8/MP7 and to the source/drain terminal of MN6/MP10.

In some embodiments, footer cross-coupled circuit 203*c* comprises n-type transistor MN9/MN10 and n-type transistor MN11/MN12 such that the drain terminal (i.e., node 'c') of transistor MP3 is coupled to the gate terminal of transistor MN11, and the drain terminal of transistor MP4 (i.e., node 'd') is coupled to the gate terminal of transistor MN10. In some embodiments, node 'c' is also coupled to the drain terminals of n-type transistor MN9/MN10 and to the source/drain terminals of MN7/MP11. In some embodiments, node 'd' is also coupled to the drain terminals of n-type transistor MN11/MN12 and to the source/drain terminal of MN8/MP12.

In some embodiments, pre-charge circuit 203*b* includes pass-gates MN5/MP9, MP10/MN6, MP11/MN7, and MP12/MN8. In some embodiments, pass-gate MN5/MP9 is coupled in series with pass-gate MN7/MP11, where the common node (or coupling node) is node 'a'. In some embodiments, pass-gate MN6/MP10 is coupled in series with pass-gate MN8/MP12, where the common node (or coupling node) is node 'b'. In some embodiments, node 'a' is coupled to Power Management Circuit 102/202 and Latch Circuit 104/204. In some embodiments, node 'b' is coupled to Power Management Circuit 102/202 and Latch Circuit 104/204. In some embodiments, node 'a' is coupled to p-type transistor MP14 while node 'b' is coupled to p-type transistor MP13. Transistors MP14 and MP13 are referred to as the pull-up devices because when they are enabled (i.e., turned on) they charge the nodes 'a' and 'b' to $V_{supply}$. In some embodiments, source terminals of transistors MP13 and MP14 are coupled to the power supply $V_{supply}$.

In some embodiments, the gate terminals of transistors MP5, MN5, MN7, MN8, MN6, MP7, and MP13 of Decision Making Circuit 103/203 are controlled by the Clk signal. In some embodiments, the gate terminals of transistors MP9, MP10, MP11, MP12, MN9, and MN12 of Decision Making Circuit 103/203 are controlled by the Clkb signal.

In some embodiments, Power Management Circuit 102/202 includes inverters inv1 and inv2 and NOR logic gate NOR1 coupled together as shown. In some embodiments, Power Management Circuit 102/202 compares the logic levels of 'a' and 'b' to determine whether to disable Input Sensing Stage 101/201. In some embodiments, Latch Circuit 104/204 latches the states of 'a' and 'b' and provides the latched outputs psa_outx and psa_out, respectively. In some embodiments, Latch Circuit 104/204 includes cross-coupled NAND logic gates NAND1 and NAND2 as shown.

Consider when the input signal "in0" is logic 0 and Clk is at high phase (i.e., logic 1). In such a case, transistor MP4 is turned on while transistor MN4 is turned off. Since nodes 'a' and 'b' are pre-charged to logic high by the pull-up transistors MP13 and MP14 when Clk was in low phase (i.e., logic 0), Power Management Circuit 102/202 enables Input Sensing Stage 101/201 (i.e., transistors MP1, MP2, MN1 and MN2 are turned on) when Clk is at high phase.

Continuing with the example, nodes 'e' and 'f' charge to $V_{supply}$ (Vcc) and nodes 'c' and 'd' discharge to logic 0 (Gnd) because the header and footer cross-coupled pass-gates 203*a* and 203*c*, respectively, are turned on. When Clk is at high phase, Clkb is at low phase, which enables Input Sensing Stage 101/201. When Clk is at high phase, pull-up transistors MP13 and MP14 are turned off. When Decision Making Circuit 103/203 makes the decision based on the states of nodes 'e', 'c', and 'd', the header and footer cross-coupled pass-gates 203*a* and 203*c*, respectively, maintain the node voltages (i.e., voltages on nodes 'e', 'c', and 'd') until the beginning of the next pre-charge phase.

During the pre-charge phase, Clk is logic 0 (i.e., low phase) and Clkb is logic 1 (i.e., high phase). In this case, Input Sensing Stage 101/201 is disabled by header and footer transistors MPa and MNa, respectively, which are turned off. When Clk is logic 0, transistors MP13, MP14, MP5, MP7, MN9, and MN12 are turned on which pull-up nodes 'a' 'b' 'e', and 'f' to $V_{supply}$ while nodes 'c' and 'd' are pulled down to ground. During the pre-charge phase, transistors MP1, MP2, MN1, and MN2 are turned on, but the path from $V_{supply}$ to ground is cut off by transistors MPa and MNa which remain off when Clk is at logic 0.

During the evaluation phase, Clk transitions from logic 0 to logic 1 (i.e., Clkb transitions from logic 1 to logic 0), the input "in0" is sensed (i.e., voltages on nodes 'e', 'c' and 'd' are sensed) and converted into currents by header and footer cross-coupled pass-gates 203a and 203c. These currents are used to charge or discharge the nodes 'c', 'd', e', and 'f.' As the nodes c', 'd', 'e', and 'f' charge/discharge, the cross-coupled transistors MP6, MP8, MN10, and MN11 resolve the values at their respective drain terminals as complementary states. For example, node 'e' is resolved to logic 1 and node 'f' is resolved to logic 0 or vice versa.

In this phase, pass-gates of pre-charge circuit 203b are turned on and so node 'e' is shorted to node 'c' via node 'a', and node 'f' is shorted to node 'd' via node 'b'. As such, nodes 'a' and 'b' attain the sensed values of the input "in0." During the evaluation phase, the header and footer transistors MNa and MPa of Input Sensing Stage 101/201 are turned on, but Power Management Circuit 102/202 is activated because nodes 'a' and 'b' have complementary states. These complementary states cause the output of Power Management Circuit 102/202 to be logic 0, which in turn causes power circuits 201a and 201d to turn off and cut the current path from $V_{supply}$ to ground in Input Sensing Stage 101/201. As such, Input Sensing Stage 101/201 is turned off during the evaluation phase, which saves power. The evaluated values on nodes 'a' and 'b' are then passed on to Latch circuit 104/204 that preserves the evaluated values during the subsequent pre-charge phase. In some embodiments, pre-charge circuit 203b is simplified by eliminating MN5, MP11, MP12, and MN6. As such, the number of transistors are reduced.

Figure 3:
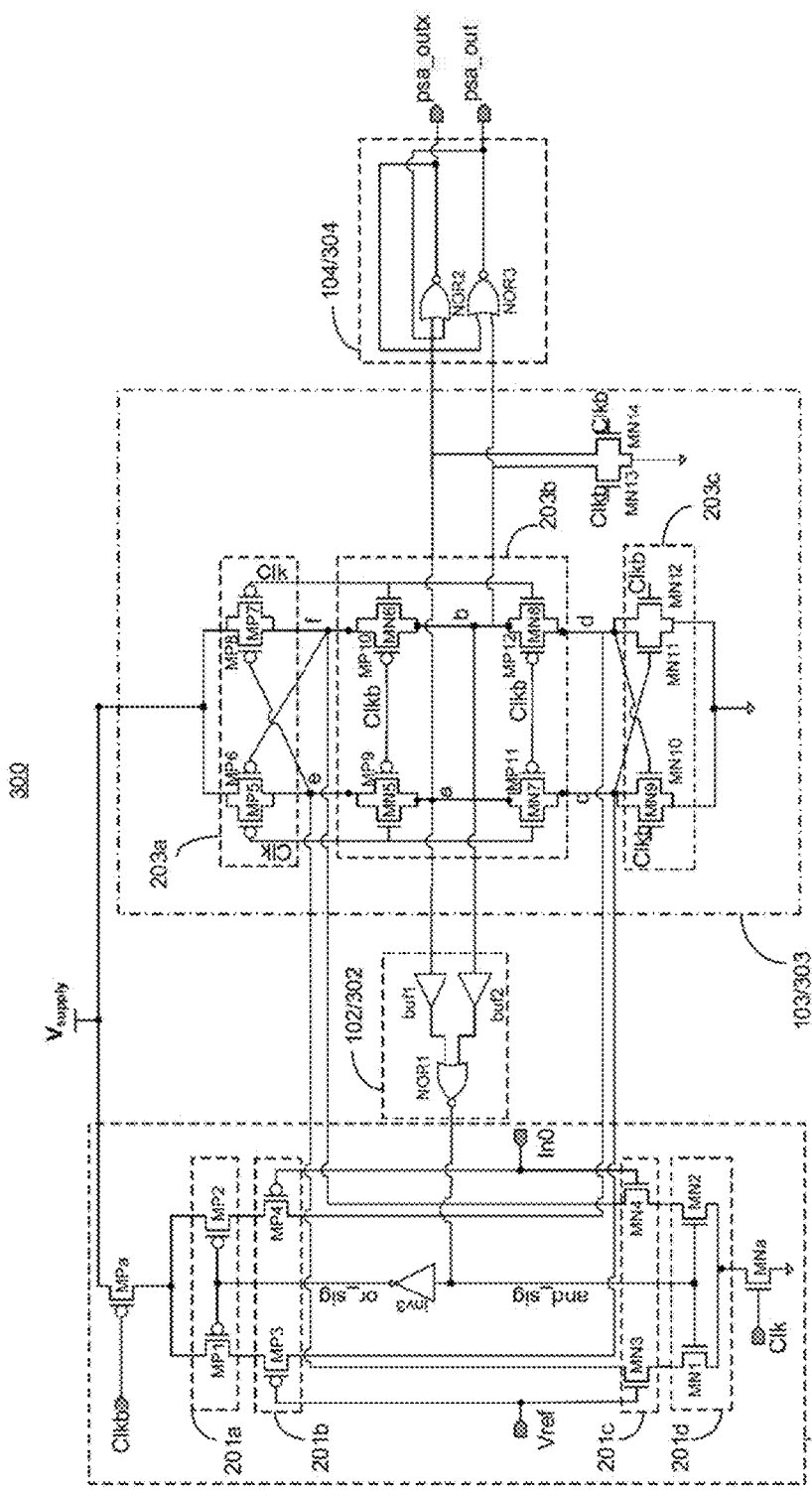
FIG. 3 illustrates a circuit implementation of a SAL, according to some embodiments of the disclosure.

FIG. 3 illustrates a circuit implementation of SAL 300, according to some embodiments of the disclosure. It is pointed out that those elements of FIG. 3 having the same reference numbers (or names) as the elements of any other figure can operate or function in any manner similar to that described, but are not limited to such. So as not to obscure the embodiment of FIG. 3, differences between FIG. 2 and FIG. 3 are described.

SAL 300 is similar to SAL 200 except that Power Management Circuit 102/302, Decision Making Circuit 103/303, and Latch Circuit 104/304 are modified. In some embodiments, pull-up devices MP12 and MP14 of Decision Making Circuit 103/203 are replaced with pull-down devices MN13 and MN14 in Decision Making Circuit 103/303, where transistors MN13 and MN14 are controllable by Clkb signals. In some embodiments, Latch Circuit 104/304 is implemented with cross-coupled NOR logic gates NOR2 and NOR3 instead of NAND1 and NAND2 logic gates. In some embodiments, the inverters inv1 and inv2 of Power Management Circuit 102/202 are replaced with buffers buf1 and buf2 respectively in Power Management Circuit 102/302. Functionally, SAL 300 and SAL 200 are similar but with alternative implementations.

Figure 4:
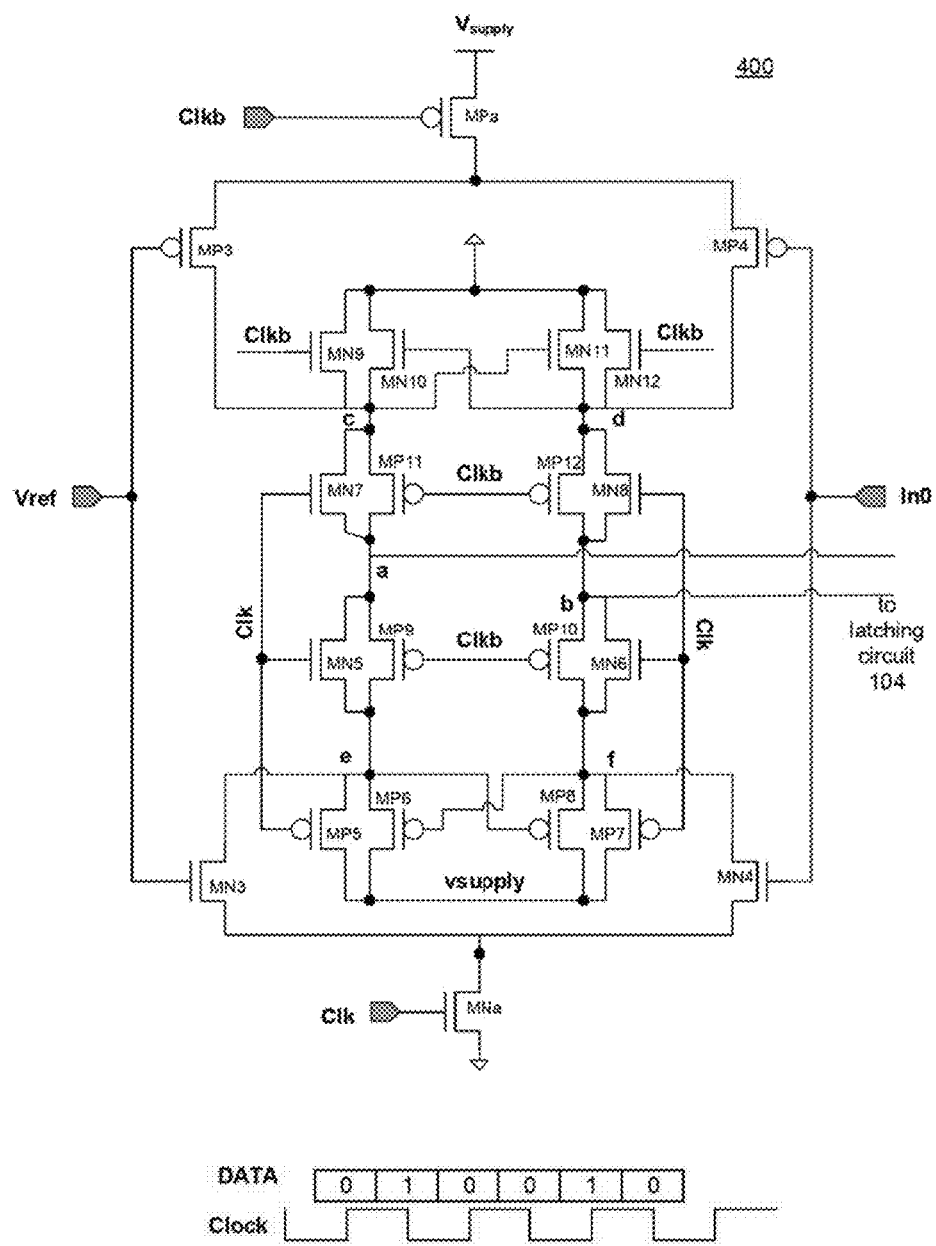
FIG. 4 illustrates a circuit implementation of a SAL with integrated input sensing stage, according to some embodiments of the disclosure.

FIG. 4 illustrates a circuit implementation of SAL 400 with integrated input sensing stage, according to some embodiments of the disclosure. It is pointed out that those elements of FIG. 4 having the same reference numbers (or names) as the elements of any other figure can operate or function in any manner similar to that described, but are not limited to such.

In this embodiments, Input Sensing Stage 101/201 is integrated with Decision Making Circuit 103/203, and Power Management Circuit 102/202 is removed. One example case where SAL 400 may be used is for high speed application (e.g., speeds of 8 Gbps and higher). At higher data rates (or speed), the pulse width of the input signal "In0" is smaller compared to the pulse width of the input signal "In0" at lower data rates. As such, for higher data rates, the amount of power savings from Power Management Circuit 102/202/302 may not be very high, and so Power Management Circuit 102/202/302 can be removed. For example, the leakage current from $V_{supply}$ to ground is much smaller for high data rates than for low data rates and so additional circuitry needed to reduce this leakage current may add more cost (in terms of area) than the savings realized by further reducing the leakage.

In some embodiments, Input Sensing Stage 101/201 is simplified to transistors MPa, MNa, MP3, MP4, MN3, and MN4 coupled together as shown. Here, transistors MP4 and MN4 are input transistors that receive input signal "In0" while transistors MP3 and MN3 receive the reference voltage "Vref" (or complementary of input signal "In0b", where "Inb0" is inverse of "In0"). In some embodiments, Decision Making Circuit is the same as Decision Making Circuit 103/203 or 103/303.

For sake of simplicity, pull-up devices MP13 and MP14 (when Decision Making Circuit 103/203 is being used) are not shown. However, pull-up devices MP13 and MP14 are used for pre-charging nodes 'a' and 'b' as described with reference to FIG. 2. In one such embodiment, Latch Circuit 104/204 with NAND gates are used for latching the outputs 'a' and 'b'. In some embodiments, when Decision Making Circuit is implemented as 103/303, then pull-down devices MN13 and MN14 are used as described with reference to FIG. 3. In one such embodiment, Latch Circuit 104/304 with NOR gates are used for latching the outputs 'a' and 'b'. Like SAL 200 and SAL 300, SAL 400 operates in three phases—pre-charge phase, evaluation phase, and latch phase—as described with reference to FIGS. 1-2.

Figure 5:
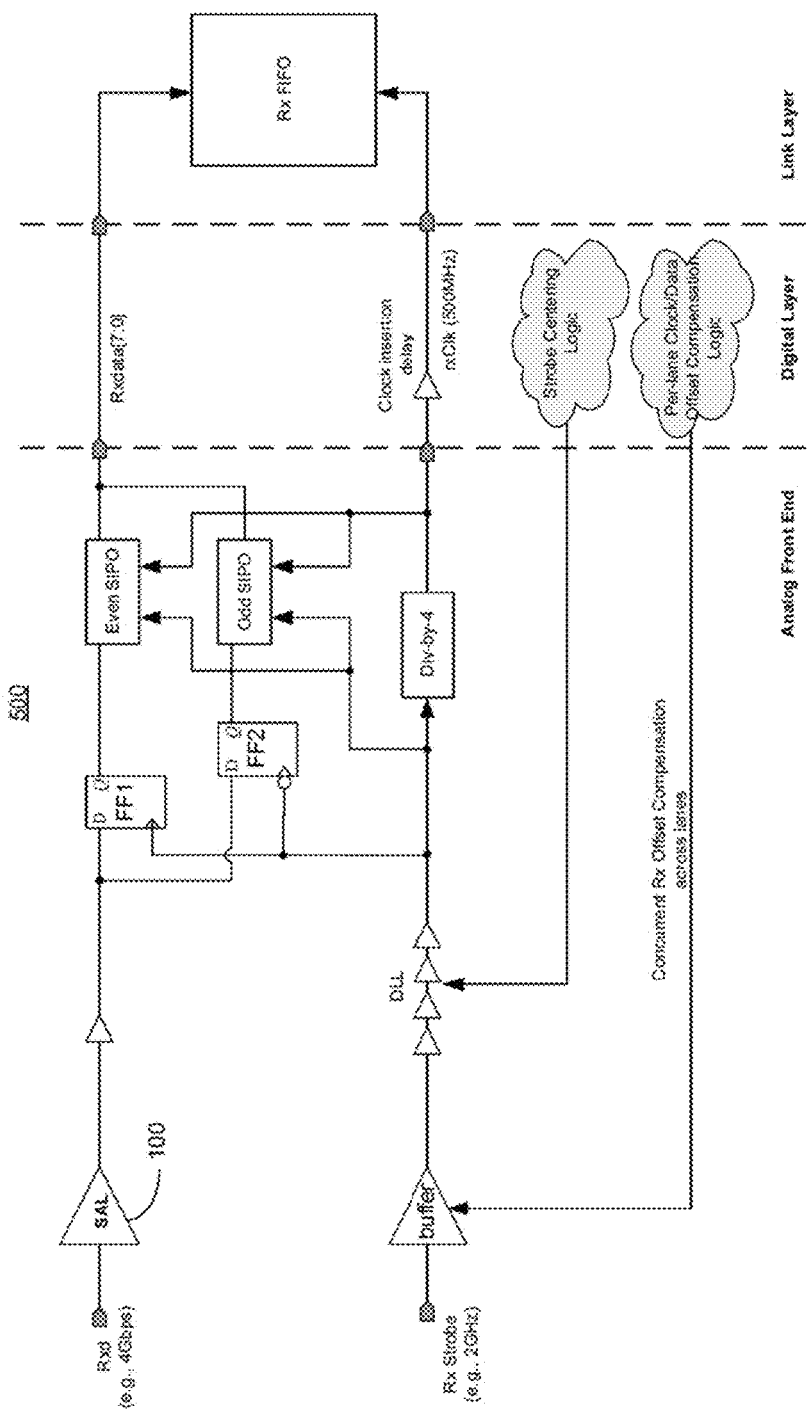
FIG. 5 illustrates a receiver having the SAL, according to some embodiments of the disclosure.

FIG. 5 illustrates a receiver (Rx) architecture 500 having the SAL (e.g., one of 200/300/400), according to some embodiments of the disclosure. It is pointed out that those elements of FIG. 5 having the same reference numbers (or names) as the elements of any other figure can operate or function in any manner similar to that described, but are not limited to such.

In some embodiments, Rx architecture 500 comprises Analog Front End (AFE), Digital Layer, and Link Layer. In some embodiments, AFE comprises SAL 100 (e.g., one of 200/300/400), buffers, Delay Locked Loop (DLL), Flip-Flops (FF1, FF2), Divider (e.g., Div-by-4 which divides by four), Even Serial Input Parallel Output (SIPO), and Odd SIPO coupled together as shown. In some embodiments, SAL 100 of AFE receives Rx data (Rxd) and resolves that data. For example, SAL 100 receives data at 4 Gbps and generates latched data. In some embodiments, the buffer of AFE receives Rx Strobe (e.g., 2 GHz clock) which is readjusted by the DLL so that the Rx Strobe is centered in latched data eye.

In some embodiments, Digital Layer comprises Strobe (i.e., clock) Centering Logic, Per-lane Clock/Data Offset Compensation Logic, and Clock insertion delay. In some embodiments, Link Layer comprises Rx FIFO (First-in-First-Out) buffer. In some embodiments, Strobe Centering Logic is operable to center the Rx Strobe in the center of the data eye to capture the data with optimum margin (i.e., highest voltage margin). In some embodiments, Per-lane Clock/Data Offset Compensation Logic is used to adjust the amplifier offset associated with clock and data amplifiers for each lane. In some embodiments, Clock insertion delay is operable to add delay to the clock (e.g., by pushing its edge out in time) for meeting timing requirements.

Figure 6:
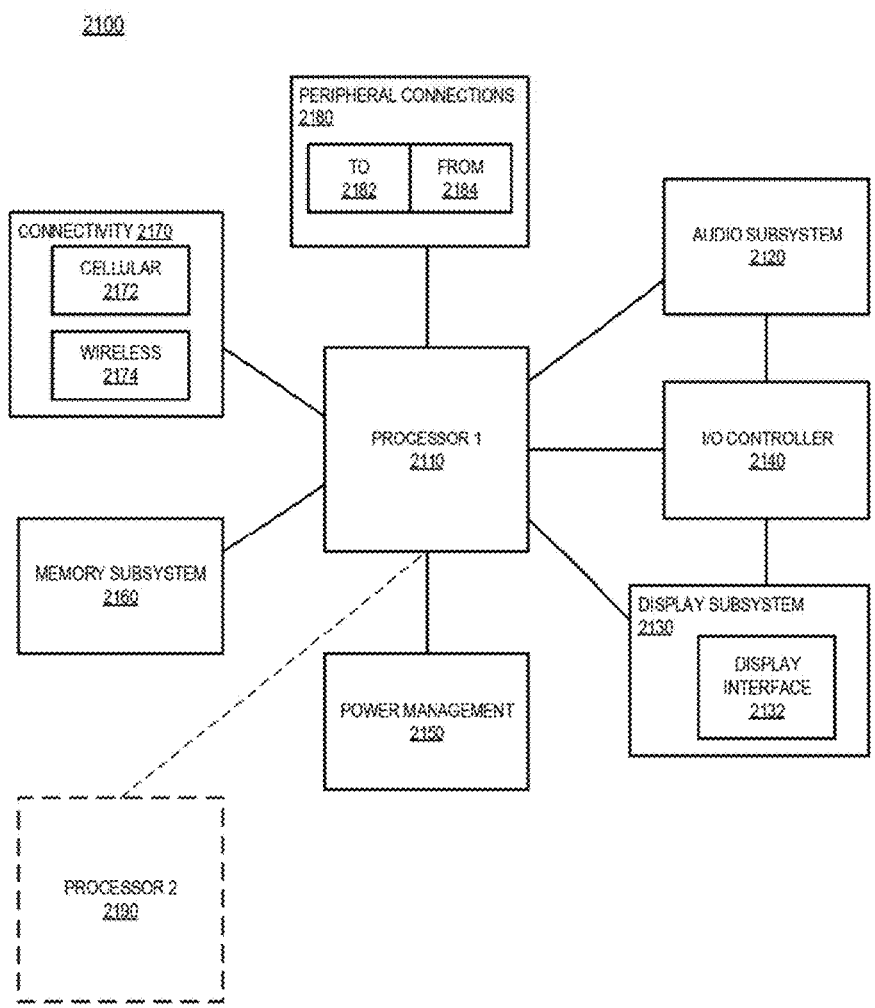
FIG. 6 illustrates a smart device or a computer system or a SoC (System-on-Chip) with an SAL, according to some embodiments.

FIG. 6 illustrates a smart device or a computer system or a SoC (System-on-Chip) with SAL 100 (e.g., SAL 200/300/400), according to some embodiments. It is pointed out that those elements of FIG. 6 having the same reference numbers (or names) as the elements of any other figure can operate or function in any manner similar to that described, but are not limited to such.

FIG. 6 illustrates a block diagram of an embodiment of a mobile device in which flat surface interface connectors could be used. In some embodiments, computing device 2100 represents a mobile computing device, such as a computing tablet, a mobile phone or smart-phone, a wireless-enabled e-reader, or other wireless mobile device. It will be understood that certain components are shown generally, and not all components of such a device are shown in computing device 2100.

In some embodiments, computing device 2100 includes a first processor 2110 with the SAL, according to some embodiments discussed. Other blocks of the computing device 2100 may also include the SAL, according to some embodiments. The various embodiments of the present disclosure may also comprise a network interface within 2170 such as a wireless interface so that a system embodiment may be incorporated into a wireless device, for example, cell phone or personal digital assistant.

In one embodiment, processor 2110 (and/or processor 2190) can include one or more physical devices, such as microprocessors, application processors, microcontrollers, programmable logic devices, or other processing means. The processing operations performed by processor 2110 include the execution of an operating platform or operating system on which applications and/or device functions are executed. The processing operations include operations related to I/O (input/output) with a human user or with other devices, operations related to power management, and/or operations related to connecting the computing device 2100 to another device. The processing operations may also include operations related to audio I/O and/or display I/O.

In one embodiment, computing device 2100 includes audio subsystem 2120, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 2100, or connected to the computing device 2100. In one embodiment, a user interacts with the computing device 2100 by providing audio commands that are received and processed by processor 2110.

Display subsystem 2130 represents hardware (e.g., display devices) and software (e.g., drivers) components that provide a visual and/or tactile display for a user to interact with the computing device 2100. Display subsystem 2130 includes display interface 2132, which includes the particular screen or hardware device used to provide a display to a user. In one embodiment, display interface 2132 includes logic separate from processor 2110 to perform at least some processing related to the display. In one embodiment, display subsystem 2130 includes a touch screen (or touch pad) device that provides both output and input to a user.

I/O controller 2140 represents hardware devices and software components related to interaction with a user. I/O controller 2140 is operable to manage hardware that is part of audio subsystem 2120 and/or display subsystem 2130. Additionally, I/O controller 2140 illustrates a connection point for additional devices that connect to computing device 2100 through which a user might interact with the system. For example, devices that can be attached to the computing device 2100 might include microphone devices, speaker or stereo systems, video systems or other display devices, keyboard or keypad devices, or other I/O devices for use with specific applications such as card readers or other devices.

As mentioned above, I/O controller 2140 can interact with audio subsystem 2120 and/or display subsystem 2130. For example, input through a microphone or other audio device can provide input or commands for one or more applications or functions of the computing device 2100. Additionally, audio output can be provided instead of, or in addition to display output. In another example, if display subsystem 2130 includes a touch screen, the display device also acts as an input device, which can be at least partially managed by I/O controller 2140. There can also be additional buttons or switches on the computing device 2100 to provide I/O functions managed by I/O controller 2140.

In one embodiment, I/O controller 2140 manages devices such as accelerometers, cameras, light sensors or other environmental sensors, or other hardware that can be included in the computing device 2100. The input can be part of direct user interaction, as well as providing environmental input to the system to influence its operations (such as filtering for noise, adjusting displays for brightness detection, applying a flash for a camera, or other features).

In one embodiment, computing device 2100 includes power management 2150 that manages battery power usage, charging of the battery, and features related to power saving operation. Memory subsystem 2160 includes memory devices for storing information in computing device 2100. Memory can include nonvolatile (state does not change if power to the memory device is interrupted) and/or volatile (state is indeterminate if power to the memory device is interrupted) memory devices. Memory subsystem 2160 can store application data, user data, music, photos, documents, or other data, as well as system data (whether long-term or temporary) related to the execution of the applications and functions of the computing device 2100.

Elements of embodiments are also provided as a machine-readable medium (e.g., memory 2160) for storing the computer-executable instructions (e.g., instructions to implement any other processes discussed herein). The machine-readable medium (e.g., memory 2160) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 2170 includes hardware devices (e.g., wireless and/or wired connectors and communication hardware) and software components (e.g., drivers, protocol stacks) to enable the computing device 2100 to communicate with external devices. The computing device 2100 could be separate devices, such as other computing devices, wireless access points or base stations, as well as peripherals such as headsets, printers, or other devices.

Connectivity 2170 can include multiple different types of connectivity. To generalize, the computing device 2100 is illustrated with cellular connectivity 2172 and wireless connectivity 2174. Cellular connectivity 2172 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 2174 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 2180 include hardware interfaces and connectors, as well as software components (e.g., drivers, protocol stacks) to make peripheral connections. It will be understood that the computing device 2100 could be a peripheral device ("to" 2182) to other computing devices, as well as have peripheral devices ("from" 2184) connected to it. The computing device 2100 commonly has a "docking" connector to connect to other computing devices for purposes such as managing (e.g., downloading and/or uploading, changing, synchronizing) content on computing device 2100. Additionally, a docking connector can allow computing device 2100 to connect to certain peripherals that allow the computing device 2100 to control content output, for example, to audiovisual or other systems.

In addition to a proprietary docking connector or other proprietary connection hardware, the computing device 2100 can make peripheral connections 2180 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. For example, other memory architectures e.g., Dynamic RAM (DRAM) may use the embodiments discussed. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, an apparatus is provided which comprises: an input sensing stage for sensing an input signal relative to another signal; a decision making circuit, coupled to the input sensing stage, for determining whether the input signal is a logic low or a logic high; and a power management circuit, coupled to the input sensing stage and the decision making circuit, which is operable to monitor a state of the decision making circuit and to disable the input sensing stage according to the monitored state.

In some embodiments, the apparatus comprises a latching circuit to latch an output of the decision making circuit. In some embodiments, the latching circuit comprises cross-coupled NAND or NOR logic gates. In some embodiments, the input sensing stage comprises gating devices for disabling current flow through the input sensing stage according to an output of the power management circuit. In some embodiments, wherein the input sensing stage is operable to sense the input signal during a phase of a clock signal.

In some embodiments, the decision making circuit is operable to pre-charge its internal nodes during a phase of the clock signal. In some embodiments, the decision making circuit is operable to generate a full-swing output signal. In some embodiments, the other signal is a reference signal. In some embodiments, the other signal is a complementary signal of the input signal.

In another example, a system is provided which comprises: a memory; a processor coupled to the memory, the processor having a receiver including a sense amplifier latch, wherein the sense amplifier latch comprises an apparatus according to the apparatus described above; and a wireless interface for allowing the processor to communicate with another device.

In some embodiments, the processor comprises a serial-input-to-parallel-output (SIPO) circuit for converting an output of the latching circuit to a parallel output. In some embodiments, the memory is one of a Magnetic Random Access Memory (MRAM) or a Dynamic Random Access Memory (DRAM).

In another example, an apparatus is provided which comprises a decision making circuit integrated with an input sensing stage, wherein the decision making circuit is operable to determine whether an input signal is a logic low or a logic high, and wherein the decision making circuit is operable to pre-charge its internal nodes during a phase of the clock signal; and a latching circuit to latch an output of the decision making circuit.

In some embodiments, the decision making circuit is operable to compare the input signal with another signal. In some embodiments, the other signal is a reference signal. In some embodiments, the other signal is a complementary signal of the input signal. In some embodiments, the decision circuit comprises at least four pass-gates coupled in series, and wherein the at least four pass-gates are controllable by a phase of the clock signal. In some embodiments, the latching circuit comprises cross-coupled NAND or NOR logic gates.

In another example, a system is provided which comprises: a memory; a processor coupled to the memory, the processor having a receiver including a sense amplifier latch, wherein the sense amplifier latch comprises an apparatus according to the apparatus described above; and a wireless interface for allowing the processor to communicate with another device.

In some embodiments, the processor comprises a serial-input-to-parallel-output (SIPO) circuit for converting an output of the latching circuit to a parallel output. In some embodiments, the memory is one of a Magnetic Random Access Memory (MRAM) or a Dynamic Random Access Memory (DRAM).

In another example, a method is provided which comprises: sensing, by an input sensing stage, an input signal relative to another signal; determining whether the input signal is a logic low or a logic high; and disabling the input sensing stage according to the determination. In some embodiments, the method comprises latching an output in response to the determining. In some embodiments, sensing comprises gating devices for disabling current flow through the input sensing stage according to an output of a power management circuit. In some embodiments, sensing comprises sensing the input signal during a phase of a clock signal. In some embodiments, the method comprises pre-charging internal nodes during a phase of the clock signal. In some embodiments, the other signal is a reference signal. In some embodiments, the other signal is a complementary signal of the input signal.

In another example, an apparatus is provided which comprises: means for sensing an input signal relative to another signal; means for determining whether the input signal is a logic low or a logic high; and means for disabling the input sensing stage according to an output of the means for determining. In some embodiments, the apparatus comprises means for latching an output in response to the output of the means for determining. In some embodiments, the means for sensing comprises means for operating gating devices for disabling current flow through the means for sensing. In some embodiments, the means for sensing comprises means for sensing the input signal during a phase of a clock signal. In some embodiments, the apparatus comprises means for pre-charging internal nodes during a phase of the clock signal. In some embodiments, the other signal is a reference signal. In some embodiments, the other signal is a complementary signal of the input signal.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
an analog front-end (AFE); and
a digital circuitry coupled to the AFE, wherein the AFE comprises:
   a strong arm latch (SAL) to receive an input signal and to provide an output, wherein the SAL has rail-to-rail input common mode range; and
   a buffer to receive a receiver strobe, wherein the buffer is operable to cancel its input offset, wherein an output of the buffer is eventually used as a clock input by a flip-flop, wherein the flip-flop is to receive an output of the SAL.

2. The apparatus of claim 1, wherein the AFE comprises:
a delay line coupled to the buffer, wherein the delay line is part of a delay locked loop (DLL); and
a divider coupled to the delay line, wherein the divider is to provide a divided clock signal.

3. The apparatus of claim 2, wherein the digital circuitry includes an offset compensation circuitry to provide an offset control signal to the buffer to cancel or compensate an input offset of the buffer.

4. The apparatus of claim 3, wherein the offset compensation circuitry is per lane.

5. The apparatus of claim 2 further comprising a centering circuitry to adjust a delay of the delay line such that an output of the delay line has a clock signal which is substantially centered in an eye of the input signal.

6. The apparatus of claim 2, wherein the buffer is a first buffer, and wherein the apparatus further comprises a second buffer coupled to an output of the SAL.

7. The apparatus of claim 6, wherein the flip-flop is a first flip-flop, wherein the apparatus further comprising a second flip-flop coupled to an output of the second buffer, wherein the second flip-flop is to receive a clock signal which is an output of the delay line.

8. The apparatus of claim 7, wherein the first flip-flop is to receive the clock signal which is the output of the delay line.

9. The apparatus of claim 8 further comprising an even serial input parallel output (SIPO) coupled to an output of the first flip-flop, wherein the even SIPO is to receive the clock signal from the delay line and an output of the divider.

10. The apparatus of claim 9 further comprising an odd SIPO coupled to an output of the second flip-flop, wherein the odd SIPO is to receive the clock signal from the delay line and the output of the divider.

11. The apparatus of claim 10 further comprising a first-in-first-output (FIFO) circuitry to receive data from the even SIPO and the odd SIPO, wherein the FIFO circuitry is to receive a clock signal from a delay circuitry coupled to the output of the divider.

12. The apparatus of claim 1, wherein the SAL includes a decision making circuit integrated with an input sensing stage, wherein the decision making circuit is operable to determine whether the input signal is a logic low or a logic high.

13. The apparatus of claim 12, wherein the decision making circuit is operable to pre-charge its internal nodes during a phase of a clock signal.

14. The apparatus of claim 12, wherein the SAL includes a latching circuit to latch an output of the decision making circuit.

15. A system comprising:
a memory;
a processor coupled to the memory, the processor including a receiver which includes:

an analog front-end (AFE); and
a digital circuitry coupled to the AFE, wherein the AFE comprises:
- a strong arm latch (SAL) to receive an input signal and to provide an output, wherein the SAL has rail-to-rail input common mode range; and
- a buffer to receive a receiver strobe, wherein the buffer is operable to cancel its input offset, wherein an output of the buffer is eventually used as a clock input by a flip-flop, wherein the flip-flop is to receive an output of the SAL; and a wireless interface to allow the processor to communicate with another device.

16. The system of claim 15, wherein the AFE comprises:
a delay line coupled to the buffer, wherein the delay line is part of a delay locked loop (DLL); and
a divider coupled to the delay line, wherein the divider is to provide a divided clock signal.

17. The system of claim 16, wherein the digital circuitry includes:
an offset compensation circuitry to provide an offset control signal to the buffer to cancel or compensate an input offset of the buffer; and
a centering circuitry to adjust a delay of the delay line such that an output of the delay line has a clock signal which is substantially centered in an eye of the input signal.

18. An apparatus comprising:
an analog front-end (AFE); and
a digital circuitry coupled to the AFE, wherein the AFE comprises a strong arm latch (SAL) to receive an input signal and to provide an output, wherein the SAL has rail-to-rail input common mode range, and wherein the SAL comprises:
- a decision making circuit integrated with an input sensing stage, wherein the decision making circuit is to determine whether an input signal is a logic low or a logic high, and wherein the decision making circuit is to pre-charge its internal nodes during a phase of a clock signal; and
- a latching circuit to latch an output of the decision making circuit.

19. The apparatus of claim 18, wherein the AFE comprises:
a buffer to receive a receiver strobe, wherein the buffer is operable to cancel its input offset;
a delay line coupled to the buffer, wherein the delay line is part of a delay locked loop (DLL); and
a divider coupled to the delay line, wherein the divider is to provide a divided clock signal.

20. An apparatus comprising:
a decision making circuit integrated with an input sensing stage, wherein the decision making circuit is operable to determine whether an input signal is a logic low or a logic high; and
a latching circuit to latch an output of the decision making circuit, wherein the decision making circuit is operable to pre-charge its internal nodes during a phase of a clock signal.

21. The apparatus of claim 20, wherein the decision making circuit and the latching circuit are part of an analog front-end (AFE).

22. The apparatus of claim 21, wherein the AFE is part of a receiver.

23. An apparatus comprising:
a first circuitry to sense a difference between two input signals, and to generate two or more outputs indicating the difference;
a second circuitry coupled to the first circuitry, wherein the second circuitry is to receive a clock to pre-charge one or more of internal nodes of the second circuity, and wherein the second circuitry is to evaluate the two or more outputs after the one or more internal nodes are pre-charged; and
a third circuitry to disable the first circuitry when the second circuitry is to evaluate the two or more outputs.

24. The apparatus of claim 23 comprises a fourth circuitry to latch one or more outputs of the second circuitry.

25. The apparatus of claim 24, wherein the one or more outputs of the second circuitry are one or more full-swing outputs.

26. The apparatus of claim 23, wherein the first circuitry is to receive the clock to enable the first circuitry.

* * * * *